United States Patent
Tepner et al.

(10) Patent No.: US 11,872,801 B2
(45) Date of Patent: Jan. 16, 2024

(54) SCREEN PRINTING FORM FOR USE IN A SCREEN PRINTING METHOD, SCREEN PRINTING DEVICE, AND SCREEN PRINTING METHOD

(71) Applicant: Fraunhofer-Gesellschaft zur Förderung der Angewandten Forschung E.V., Munich (DE)

(72) Inventors: Sebastian Tepner, Freiburg (DE); Maximilian Pospischil, Freibug (DE); Andreas Lorenz, Freiburg (DE); Linda Ney, Freiburg (DE); Michael Linse, Freiburg (DE); Florian Clement, Freiburg (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 118 days.

(21) Appl. No.: 17/634,012

(22) PCT Filed: Aug. 3, 2020

(86) PCT No.: PCT/EP2020/071833
§ 371 (c)(1),
(2) Date: Feb. 9, 2022

(87) PCT Pub. No.: WO2021/032456
PCT Pub. Date: Feb. 25, 2021

(65) Prior Publication Data
US 2022/0348001 A1    Nov. 3, 2022

(30) Foreign Application Priority Data
Aug. 16, 2019  (DE) .......................... 102019122126.9

(51) Int. Cl.
*B41F 15/36*    (2006.01)
*H01L 31/0224*  (2006.01)
*H05K 3/12*     (2006.01)

(52) U.S. Cl.
CPC ...... *B41F 15/36* (2013.01); *H01L 31/022425* (2013.01); *H05K 3/1225* (2013.01); *B41P 2215/12* (2013.01); *B41P 2215/50* (2013.01)

(58) Field of Classification Search
CPC ...... B41F 15/36; B41N 1/24; B41P 2215/212; B41P 2215/50; H01L 31/18; H01L 31/022425; Y02E 10/50
See application file for complete search history.

(56) References Cited

U.S. PATENT DOCUMENTS

2009/0025581 A1    1/2009  Cho et al.

FOREIGN PATENT DOCUMENTS

| CN | 104441943 | 3/2015 |
| CN | 107081958 | 8/2017 |

(Continued)

*Primary Examiner* — Christopher E Mahoney
*Assistant Examiner* — Marissa Ferguson-Samreth
(74) *Attorney, Agent, or Firm* — Volpe Koenig

(57) ABSTRACT

A screen printing form (1, 1') for use in screen printing, in particular for producing a metallic contact structure of a photovoltaic solar cell, having a woven screen printing fabric (1b) with a plurality of elongate woven fabric elements, which are arranged in a first element direction and a second element direction perpendicular thereto, and a stencil (1c), arranged on the woven screen printing fabric (1b) that has at least one opening formed as straight channel with a channel width BK. The woven fabric elements have a spacing AF in the first element direction and a spacing which deviates by less than 5% from AF in the second element direction, and the woven fabric elements have a diameter DG in the first element direction and a diameter which (Continued)

deviates by less than 5% from DG in the second element direction. A screen printing device and screen printing form are also provided.

10 Claims, 4 Drawing Sheets

(56) References Cited

FOREIGN PATENT DOCUMENTS

DE 102007059794 6/2009
DE 102011082240 8/2021

SCREEN PRINTING FORM FOR USE IN A SCREEN PRINTING METHOD, SCREEN PRINTING DEVICE, AND SCREEN PRINTING METHOD

TECHNICAL FIELD

The invention relates to a screen printing form for use in a screen printing method, an associated screen printing method and a screen printing device for applying a screen printing paste to a substrate.

BACKGROUND

To apply a screen printing paste to a substrate, it is known to press the screen printing paste through a screen printing form by means of a squeegee, in order to apply the screen printing paste to a substrate. The screen printing form has a woven screen printing fabric with a plurality of elongate woven fabric elements, typically woven fabric wires, which is permeable to the screen printing paste. In order to achieve structuring of the screen printing paste passing through the screen printing form, a stencil which has at least one opening is arranged on the woven screen printing fabric, so that screen printing paste passes through the screen printing form only in the area of the one or more openings of the stencil, and thus a structure made of screen printing paste and predefined by the opening can be applied to the substrate.

In many areas, it is desirable to produce narrow, straight structures of screen printing paste on the substrate. This is true in particular when a screen printing method is used during the production of photovoltaic solar cells. Here, it is known to produce dopings and/or metallizations on a surface of a semiconductor layer by means of a screen printing paste, by the screen printing paste correspondingly having doping substances and/or metal particles.

In particular to produce so-called metallization fingers of a metallic contact structure for making contact with a photovoltaic solar cell, it is desirable to apply elongate straight structures of screen printing paste which have a low width, in order, for example, to reduce shading of incident radiation by the metallization structure and/or to reduce recombination losses at a metal/semiconductor interface.

The production of elongate straight structures of screen printing paste is, however, also necessary in other applications, for example in the area of printed electronics, conductor tracks and/or electronic components being produced.

SUMMARY

The present invention is therefore based on the object of providing a screen printing form, a screen printing method and a screen printing device which permit the application of an elongate straight screen printing structure with a low width and nevertheless low fluctuation in the material application.

This object is achieved by a screen printing, a screen printing device, a printing method and the use of a screen printing form, all including one or more of the features disclosed herein. Advantageous refinements will be found below and in the claims.

The present invention is based on the finding that junctions at which woven fabric elements of the screen printing fabric cross can lead to a reduced application of screen printing paste to the substrate so that, in areas of the junctions, a lower material application of screen printing paste is carried out as compared with the areas without junctions, and thus an inhomogeneous structure of screen printing paste is produced, for example with a varying width and/or height.

This is based on the fact that in the areas of crossing woven fabric elements there is in section a lower passage area for screen printing paste as compared with areas without or with few crossing points.

In particular in the case of screen printing forms for producing straight structures of low width, an error source based in the crossing points is eminent if the width of the opening in the stencil of the screen printing form is in the region of or smaller than the spacing of two woven fabric elements. In this case, considerable percentage fluctuations arise with regard to the applied quantity of screen printing paste in the area of the crossing woven fabric elements, so that disadvantages result in the structure produced, for example increased line resistances in the case of a produced metallic contact structure.

To avoid these error sources, it is known to use so-called 0° grids. Such a screen printing form has a plurality of woven fabric elements which are arranged in a first element direction and a second element direction perpendicular thereto. The element directions thus correspond to the thread directions in fabrics consisting of threads. The stencil arranged on the woven screen printing fabric has an opening in the form of a straight channel, for example a rectangular opening. In the case of 0° grids, the longitudinal extent of the channel runs parallel to the first or the second element direction. Furthermore, the width of the channel is less than the spacing of the woven fabric elements perpendicular to the longitudinal extent of the channel. The stencil can thus be arranged on the woven screen printing fabric in such a way that, in the area of the channel, there are exclusively woven fabric elements running perpendicular to the channel, and the channel thus has no junctions, which means no crossing woven fabric elements.

Such 0° grids firstly have the disadvantage that the stability of the screen printing form and, as a result, also the lifetime, is significantly reduced since there is a highly reduced number of woven fabric elements in the channel and thus a predetermined break point is produced. Empirical investigations show that the lifetime of a 0° screen is approximately 30% lower than the lifetime of screens having a conventional angle of 22.5° between the channel and one of the two element directions. Furthermore, in 0° screens there is the disadvantage that the production is associated with significantly higher wastage, since a faulty alignment, that is to say a faulty positioning of the channel, relative to the woven fabric elements running parallel to the channel leads to the entire channel being covered with a wire along the channel opening, and thus the resultant opening area being considerably minimized. As a result, complicated re-working becomes necessary in the production process, or there is a screen printing form that can no longer be used.

The screen printing form according to the invention is designed for use in a screen printing method, in particular for producing a metallic contact structure of a photovoltaic solar cell. The screen printing form has a woven screen printing fabric with a plurality of elongate woven fabric elements, which are arranged in a first element direction and a second element direction perpendicular thereto. The woven screen printing fabric can advantageously be arranged in a screen printing frame known per se, in particular a rectangular screen printing frame of the screen printing form. The elongate woven fabric elements are preferably formed as woven wires; likewise, the design as a woven fabric thread also lies within the scope of the invention.

The woven fabric elements of the screen printing form according to the invention preferably have the same spacing from one another in both element directions and, more preferably, all the woven fabric elements have the same diameter. However, manufacturing tolerances often occur during production. The woven fabric elements of a screen printing form according to the invention therefore have a spacing AF at least in the first element direction and a spacing which deviates by less than 5% from AF in the second element direction, and the woven fabric elements have a diameter DG in the first element direction and a diameter which deviates by less than 5% from DG in the second element direction. It is advantageous that the woven fabric elements have a spacing AF in the first element direction and a spacing which deviates by less than 2% from AF, preferably is the same as the spacing AF in the second element direction, and/or the woven fabric elements have a diameter DG in the first element direction and a diameter which deviates by less than 2% from DG, preferably is the same as the diameter DG in the second element direction.

The screen printing form according to the invention further has a stencil arranged on the woven screen printing fabric, which has at least one opening in the form of a straight channel. The channel thus forms an elongate longitudinal opening in the stencil, which is preferably a rectangular opening.

It is essential that the channel encloses with the first element direction one of the following angles $\varphi$ with a tolerance of +/−0.1°, and the channel width BK of the channel is less than or equal to the maximum width BKmax associated with the angle $\varphi$:

an angle $\varphi[°]$ from the group 11.31°, 14.04°, 18.44°, 26.57°, 45° with an associated maximum width BKmax [μm] according to $$BK_{max} = (2DG+AF)\sin\varphi + DG\cos\varphi$$

or an angle $\varphi[°]=33.69°$, with an associated maximum width BKmax [μm] according to $$BK_{max} = (2DG+AF)\cos\varphi + AF\sin\varphi,$$

in each case with the aforementioned parameters spacing AF [μm} and diameter DG [μm].

Furthermore, in the screen printing form according to the invention, the channel width BK is less than the spacing between two woven fabric elements in the second element direction and in the first element direction.

Extensive investigations and calculations by the applicant have shown that even in the case of channels not running parallel to one of the element directions, screen printing forms are possible which have no junctions, that is to say no crossing woven fabric elements, in the channel area or at least a reduced number of junctions as compared with previously known woven screen printing fabrics, in which the channels run at an angle of 22.5° to one of the element directions.

However, such an advantage is achieved only with specific angles, wherein an upper limit of the width of the channel is additionally given for each angle, as indicated in the BKmax conditions indicated in the foregoing.

The screen printing form according to the invention has the advantage that no or at least a reduced number of junctions are present in the channel area and nevertheless avoids disadvantages of the 0° grid; in particular a considerably higher stability is provided as compared with the 0° grids. Furthermore, the screen printing form according to the invention has the advantage that even in the event of a faulty alignment, no screens with a great deficiency or even unusable screens are produced, as is the case in 0° screens, but screens which correspond approximately to the quality of the commercially available 22.5° screens. Even in the event of a production defect, the product can thus always still be used for methods which require only the quality of screens known per se with an angle of 22.5°.

The production of a woven screen printing fabric per se already makes high demands on the precision of the apparatus used. It is therefore advantageous that the spacing AF of the woven fabric elements in the first element direction and in the second element direction deviate by less than 2% from each other, in particular that the spacing AF of the woven fabric elements in the first element direction and the second element direction is the same, and/or in that the diameter DG of the woven fabric elements in the first element direction and the diameter of the woven fabric elements in the second element direction deviate by less than 2%, in particular the diameter DG of the woven fabric elements in the first element direction and the diameter of the woven fabric elements in the second element direction is the same.

Advantageously, therefore, the spacing of the woven fabric elements in the first element direction and in the second element direction is the same. As a result, it is possible to rely on commercially available high-quality woven screen printing fabrics.

The above-described advantages already result if the stencil of the screen printing form—if appropriate in addition to further openings, in particular non-straight openings—has only one straight channel which fulfils the previously described conditions.

In many applications, in particular during the production of photovoltaic solar cells, it is, however, advantageous to provide a plurality of straight channels running in parallel in the stencil, in order accordingly to apply a plurality of structures of screen printing paste running straight and parallel to the substrate. This is the case in particular during the production of metallic contact structures of a solar cell and/or selective doping structures, in particular selective emitter structures of a photovoltaic solar cell.

Advantageously, the stencil therefore has a plurality of straight, parallel channels. In particular, it is advantageous that the stencil has at least 0.5 channels/mm, in particular at least 1 channel/mm. In particular, for typical substrates sizes, it is advantageous if the stencil has at least 50, preferably at least 100, in particular at least 150 channels. The channel width preferably lies in the range from 10 μm to 150 μm.

If the screen printing form has a plurality of channels running in parallel, it is advantageous that the channels have a spacing which corresponds an integer multiple of the spacing of the woven fabric elements in the first and/or second element direction. It is thus in particular within the scope of the invention that the channels have a spacing which corresponds to an integer multiple both of the spacing of the woven fabric elements in the first element direction and also in the second element direction. This is always the case if, as previously described in an advantageous embodiment, the spacing of the woven fabric elements in the first and second element direction is the same.

This results in the advantage that an optimal alignment of a channel always also results in an optimal alignment of all the channels running in parallel with the previously specified condition.

A more detailed examination of the arrangement of junctions in woven fabric elements with a first and a second element direction perpendicular thereto shows that it is possible to distinguish between four types of junction. Two crossing woven fabric elements can be assigned to a junction with four corners. This will also be explained in more detail further below in the figure description with reference to FIG. 6.

The conditions listed at the start and in claim 1 lead to no junctions having all four associated corners being located in the opening area of the channel (condition $BKmax=BK_{max321}$) or at least only a considerably reduced number. However, it is advantageous if the number of junctions having two corners or one corner (condition $BKmax=BK_{max21}$), more preferably having only one corner (condition $BKmax=BK_{max1}$) located in the area of the channel opening, is also eliminated or at least reduced. It is particularly advantageous if no corner of a junction lies in the area of the channel opening or at least the number thereof is considerably reduced (condition $BKmax=BK_{max0}$).

This further improves the homogeneity of the structure of screen printing paste produced.

To achieve the aforementioned conditions, it is therefore advantageous that the channel encloses with the first element direction one of the following angles φ with a tolerance of +/−0.1°, and the channel width BK of the channel is less than or equal to the maximum width BKmax associated with the angle φ:

an angle φ[°] from the group 11.31°, 14.04°, 18.44°, 26.57°, 45° with an associated maximum width BKmax [μm] according to $$BK_{max,21}=AF \sin \varphi + DG \cos \varphi$$

or an angle φ[°]=33.69°, with an associated maximum width BKmax [μm] according to $$BK_{max,21}=(2DG+AF)(\cos \varphi - \sin \varphi),$$

in particular that the channel encloses with the first element direction one of the following angles φ with a tolerance of +/−0.1°, and the channel width BK of the channel is less than or equal to the maximum width BKmax associated with the angle φ:

an angle φ[°] from the group 11.31°, 14.04°, 18.44°, 26.57°, 45° with an associated maximum width BKmax [μm] according to $$BK_{max,1}=(2DG+AF)\sin \varphi - \cos \varphi$$

or an angle φ[°]=33.69°, with an associated maximum width BKmax [μm] according to $$BK_{max,1}=AF(\cos \varphi - \sin \varphi),$$

preferably that the channel (1d) encloses with the first element direction one of the following angles φ with a tolerance of +/−0.1°, and the channel width BK of the channel is less than or equal to than the maximum width BKmax associated with the angle φ:

an angle φ[°] from the group 11.31°, 14.04°, 18.44°, 26.57°, 45° with an associated maximum width $BK_{max}$ [μm] according to $$BK_{max,0}=AF \sin \varphi - DG \cos \varphi$$

or an angle φ[°]=33.69°, with an associated maximum width $BK_{max}$ [μm] according to $$BK_{max,0}=AF \cos \varphi -(2DG+AF)\sin \varphi.$$

Investigations by the applicant show that with the conditions $BKmax=BK_{max,1}$ and $BKmax=Bk_{max0}$, solutions do not exist for all ratios of spacing AF and diameter DG. Advantageously, the spacing AF and diameter DG are therefore chosen in such a way that with the condition $BKmax=BK_{max1}$ and an angle φ[°] from the group 11.31°, 14.04°, 18.44°, 26.57°, 45°, the condition $$\varphi < \tan^{-1}\left(\frac{DG}{DG+AF}\right)$$

additionally applies, and with φ[°]=33.69°, the condition $$\varphi < \tan^{-1}\left(\frac{AF}{AF+DG}\right)$$

additionally applies, with the condition $BKmax=BK_{max0}$ and an angle φ[°] from the group 11.31°, 14.04°, 18.44°, 26.57°, 45°, the condition $$\varphi > \tan^{-1}\left(\frac{DG}{AF}\right)$$

additionally applies, and with φ[°]=33.69°, the condition $$\varphi > \tan^{-1}\left(\frac{AF}{AF+DG}\right)$$

additionally applies.

In the following table, examples of conditions for advantageous embodiments of the screen printing form according to the invention which lead to the aforementioned improvements are listed. The calculation of the values of BKmax is carried out for a fabric having the parameters wire number (480 wires per inch, AF=41.92 μm) and wire diameter (DG=11 μm). The index "321" points to the fact that only junctions with three, two or one corner point occur in the channel (analogous to the condition in claim 1), "21" that only junctions with two or one corner point occur in the channel, "1" that only junctions with one corner point occur in the channel, and "0" that no junction corner point occurs in the channel (analogous to the conditions in claim 5). The precondition for this is the correct alignment of the channel on the fabric.

| φ[°] | $BK_{max, 321}$[μm] | $BK_{max, 21}$[μm] | $BK_{max, 1}$[μm] | $BK_{max, 0}$[μm] |
| --- | --- | --- | --- | --- |
| 45 +/− 0.1 | 53.0 | 37.4 | 37.4 | 21.9 |
| 33.69 +/− 0.1 | 30.0 | 17.7 | — | — |
| 26.57 +/− 0.1 | 38.4 | 28.6 | 18.8 | 8.9 |
| 18.4 +/− 0.1 | 30.7 | 23.7 | 9.8 | 2.8 |
| 14.04 +/− 0.1 | 26.2 | 20.8 | 4.8 | — |
| 11.31 +/− 0.1 | 23.3 | 19.0 | — | — |

The object mentioned at the beginning is further achieved by a screen printing device for applying a screen printing paste to a substrate. The screen printing device has a screen printing form according to the invention, in particular a preferred embodiment thereof, and at least one squeegee. The screen printing device is designed to apply screen printing paste to a substrate through the screen printing form by means of the squeegee. The screen printing device according to the invention therefore does not differ in its basic structure from previously known screen printing devices but the screen printing form has the particular configuration as previously described.

In particular, in an advantageous refinement, the screen printing device can be designed as a flatbed screen printing device known per se. Likewise, it lies within the scope of the invention that the screen printing device is designed as a rotary screen printing device known per se.

Accordingly, within the scope of the invention, the screen printing form according to the invention is designed for use in a flatbed screen printing method and, in particular, has substantially flat form. Likewise, it lies within the scope of the invention that the screen printing form according to the invention is designed for use in a rotary screen printing method, in particular that the screen printing form has a cylindrical or at least partly cylindrical form.

The object mentioned at the beginning is further achieved by a printing method for applying a screen printing paste to a substrate, wherein screen printing paste is applied to a substrate through a screen printing form by means of at least one squeegee. It is important that the screen printing form is designed according to the previously described screen printing form according to the invention, in particular a preferred embodiment thereof.

The object mentioned at the beginning is further likewise achieved by the use of a screen printing form according to the invention, in particular a particularly preferred embodiment thereof, in a screen printing method.

The above-described conditions are used to avoid or at least reduce junctions in the channel of the screen printing form. To this end, it is advantageous to achieve the most accurate compliance possible with the respectively predefined angle. It is therefore advantageous to achieve an angular tolerance of +/−0.05°, in particular of +/−0.01°.

BRIEF DESCRIPTION OF THE DRAWINGS

Further advantageous features and preferred embodiments will be explained in more detail below by using exemplary embodiments and the figures, in which.

DETAILED DESCRIPTION

The figures show schematic illustrations that are not to scale. The same designations in the figures designate the same or equivalent elements.

Figure 1:
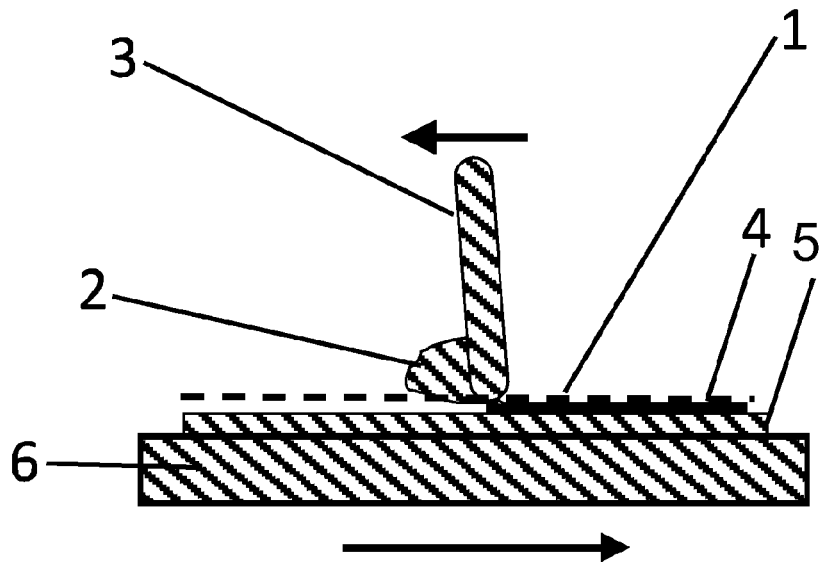
FIG. 1 shows a first embodiment of a screen printing device according to the invention for flatbed screen printing.

FIG. 1 illustrates a first exemplary embodiment of a screen printing device according to the invention in side view. The device is designed to carry out a flatbed screen printing method.

The device has a screen printing form 1 which is designed as a flatbed screen printing form. The screen printing form 1 is partially permeable to a screen printing paste 2 and partially impermeable to the screen printing paste 2, in order to form a predefined structure. This will be explained in more detail below using FIGS. 3 and 4.

The printing paste 2 in the present case is a printing paste containing metal particles, which is used, following thermal treatment, to form a metallic contact structure in the form of a contact grid known per se on the front side of a photovoltaic solar cell.

The device has a squeegee 3, which can be moved by motorized means, not illustrated, along the direction indicated by the arrow depicted above the squeegee. As a result, the screen printing paste 2 is swept over the screen printing form 1 and passes through the screen printing form 1 at the permeable points, so that the structure 4 of screen printing paste is applied to a substrate 5.

In the present case, the substrate 5 is formed as a silicon wafer, which already has p-doped and n-doped areas for forming emitter and base. The substrate 5 thus constitutes a solar cell precursor; to finish the solar cell, it further requires the arrangement of the metallic contact structure on the front side of the semiconductor substrate 5.

The device has a feed unit for feeding and discharging semiconductor substrates, which has a conveyor belt (not illustrated), on which a plurality of shuttles are arranged. By way of example, a shuttle 6 with a substrate 5 lying thereon is illustrated in FIG. 1.

Figure 2:
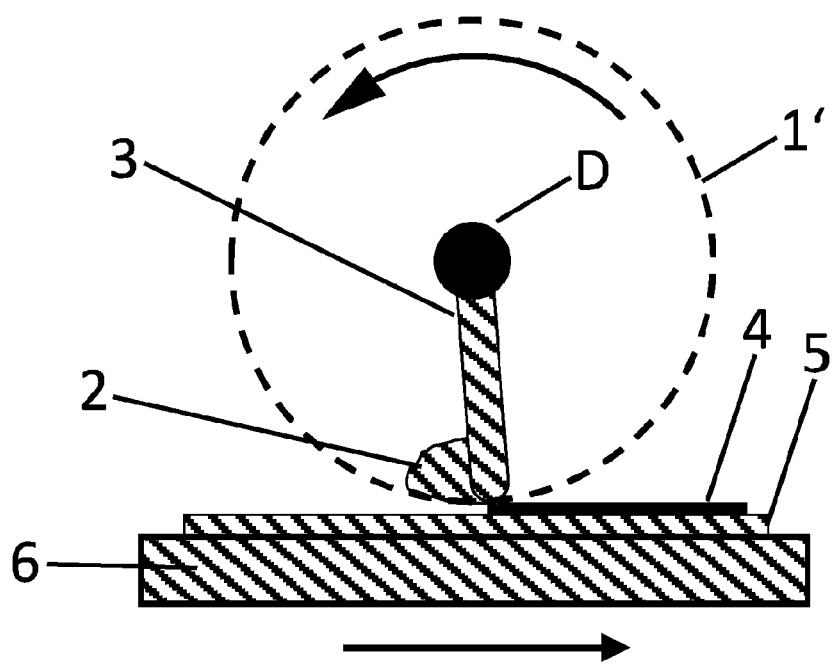
FIG. 2 shows a second embodiment of a screen printing device according to the invention for rotary screen printing.

A second exemplary embodiment of a printing device according to the invention is illustrated in FIG. 2 as an alternative embodiment. This printing device is designed to carry out a rotary screen printing method. As a comparison of FIGS. 1 and 2 shows, some elements are designed and arranged identically. However, it is important that, in the second exemplary embodiment according to FIG. 2, the screen printing form 1' is designed as a round screen with a cylindrical form. The squeegee 3 is arranged in the interior of the cylindrically formed screen printing form 1', with the result that the printing paste 2 is forced outward through the screen printing form from the interior of the screen printing form 1', in order to form the structure 4 of printing paste on the substrate 5.

To this end, the screen printing form 1' formed as a round screen has an axis of rotation 1a and is rotatable by motorized means in the direction identified by the circularly curved arrow. The axis of rotation 1a is thus perpendicular to the drawing plane in FIG. 2.

At the same time, by means of the shuttle 6, the semiconductor substrate 5 is moved in the direction illustrated as a rectilinear arrow, in such a way that the relative speed between substrate 5 and lateral surface of the screen printing form 1' at the contact point between the screen printing form 1' and the substrate 5 is zero or negligibly low.

On the other hand, the squeegee 3 carries out no rotational movement, so that the printing paste 2 is pressed against the squeegee 3 in the interior of the screen printing form 1' because of the rotational movement of the screen printing form 1' and, by means of the squeegee, is applied to the substrate 5 through the screen printing form.

The screen printing forms 1 and 1' are in principle constructed in the same way; only the screen printing form 1 has a flat, rectangular form, whereas the form of the screen printing form 1' corresponds to the lateral surface of a cylinder.

Figure 3:
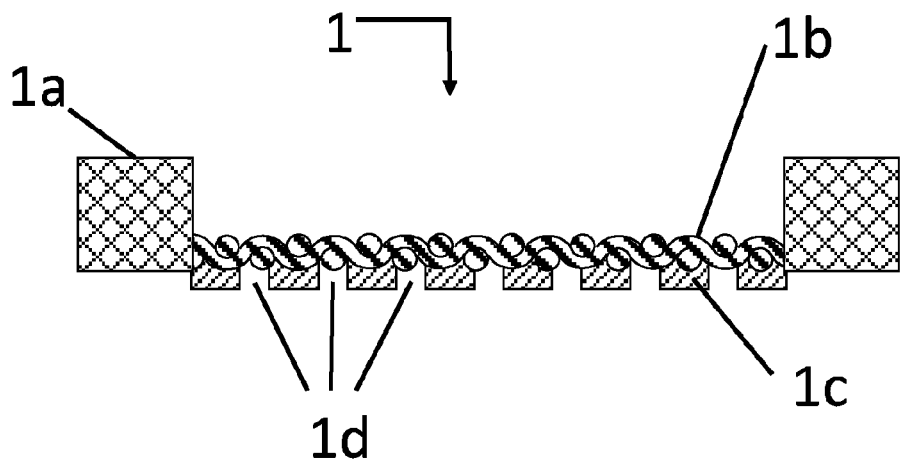
FIG. 3 shows a sectional illustration of an exemplary embodiment of a screen printing form according to the invention of the screen printing device according to FIG. 1.

FIG. 3 illustrates a cross section through the screen printing form 1 of the device according to FIG. 1. The screen printing form 1 has a rectangular frame 1a, in which a screen printing fabric 1b is stretched. The screen printing fabric 1b has a multiplicity of woven fabric elements, which are arranged in a first element direction and a perpendicular element direction. The first element direction is perpendicular to the drawing plane according to FIG. 3 and, correspondingly, the second element direction according to the illustration in FIG. 3 lies parallel to the drawing plane.

Arranged on the screen printing fabric 1b is a stencil 1c, which formed as an emulsion in a manner known per se. The stencil 1c has a multiplicity of openings, which are each formed as a straight, elongate channel 1d. The channels of the screen printing form 1 run parallel to one another and perpendicular to the drawing plane according to FIG. 3 and, in the present case, have identical widths. By way of example, three channels 1d are identified in FIG. 3.

If, then, screen printing paste is pressed onto the screen printing form 1 from above by means of the squeegee in FIG. 3, then the screen printing paste can pass through the screen printing form only in the area of the channels 1d, so that a structure of screen printing paste corresponding to the positive form of the channels is produced on a substrate lying under FIG. 3, which structure consists of a corresponding multiplicity of lines of screen printing paste arranged parallel to one another.

Figure 4:
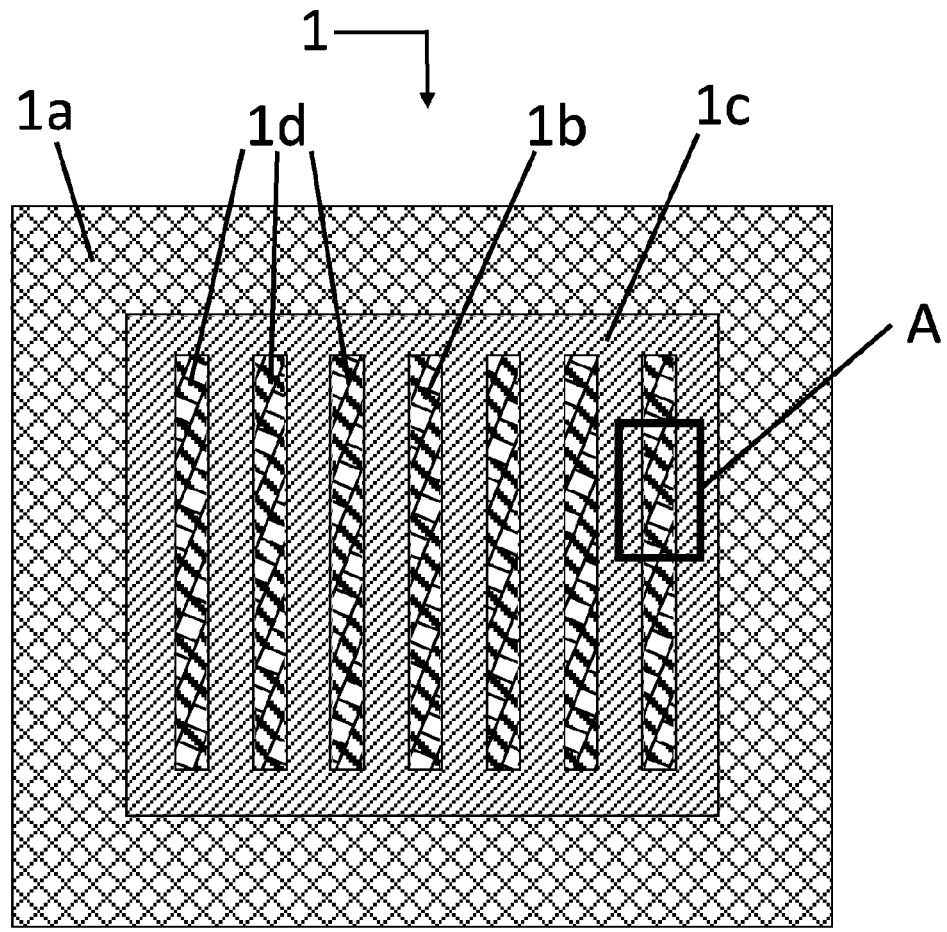
FIG. 4 shows a plan view from above of the screen printing form according to FIG. 3.

FIG. 4 shows a rear view from below of the screen printing form 1 according to FIG. 3. It is illustrated schematically that, in the area of the openings of the stencil 1c, which means in the area of the channels 1d, the screen printing form is not completely open, since woven fabric elements of the screen printing fabric 1b run underneath the channels 1d.

The screen printing forms according to the invention are distinguished by the fact that in the areas of the channels 1d there are no or at least a reduced number of junctions of the screen printing fabric 1b, so that a homogenous structure of screen printing paste can be produced. Nevertheless, the woven fabric elements of the screen printing fabric 1b do not run perpendicular to the longitudinal extent of the channels 1d, which means not horizontally in FIG. 4, as would be the case in a 0° screen printing form. This will be explained in more detail in FIG. 5 by using a detail from FIG. 4.

Figure 5:
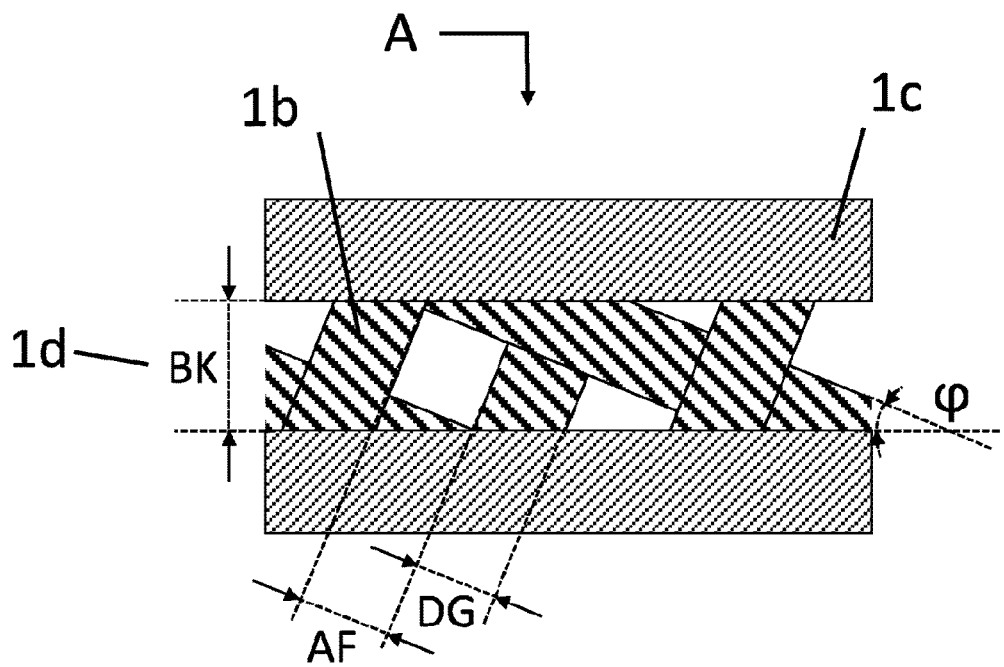
FIG. 5 shows an enlargement of a detail from FIG. 4.

FIG. 5 shows a horizontal illustration of the detail from FIG. 4 identified by A. The length dimensions of the channel width BK, of the diameter of the woven fabric elements DG and of the spacing between two parallel woven fabric elements (open space) AF and the angle φ between woven fabric elements and channel edge are identified.

Different types of overlaps are illustrated in FIG. 6, in order to indicate the presence of a junction, that is to say a crossed area of two woven fabric elements extending perpendicularly to each other, in the opening area of the stencil 1c, that is to say within a channel 1d.

In FIGS. 6A-6D, the outer limits of the junctions K are identified by thickened lines.

Figure 6A:
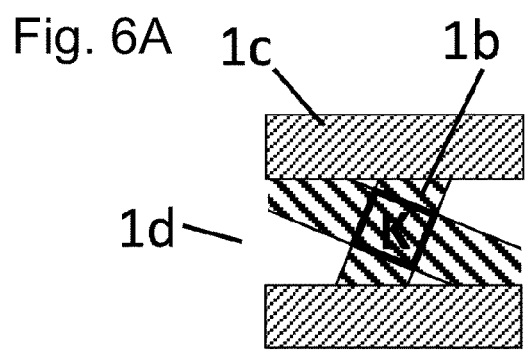
FIGS. 6A-6D show partial illustrations to explain exclusion criteria of the presence of junction components.
Figure 6B:
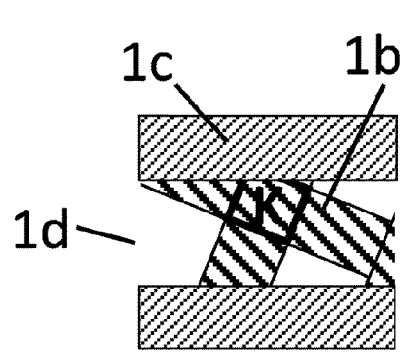

As can be seen in FIG. 6A, a junction K can be arranged in such a way that all four corners are located within the channel 1d. This represents an unfavorable arrangement, since the junction K leads to high area coverage within the channel 1d, so that there is a high risk of an inhomogeneous application of paste in the longitudinal direction of the channel 1d. The situation according to FIG. 6A is avoided or at least considerably reduced by the conditions named in claim 1.

However, it is advantageous if a reduced number of the corner points of the junction K is present in the area of the channel 1d. Thus, in the arrangement according to FIG. 6B, although one corner of the junction K (the upper left corner) is already arranged underneath the stencil 1c, three corners of the junction K nevertheless remain within the channel 1d, so that there is a reduced risk but still a risk of an inhomogeneous application of paste.

Figure 6C:
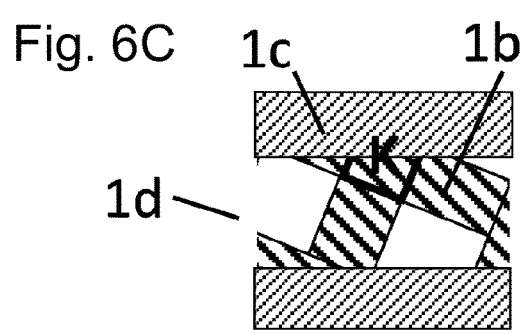
Figure 6D:
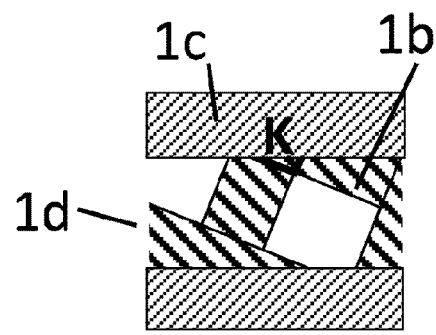

In a corresponding way, according to the illustration in FIG. 6C, it is further advantageous to choose the arrangement in such a way that only two of the corner points of the junction K lie within the channel 1d, whereas the other two corner points are located under the stencil 1c. It is also advantageous, according to FIG. 6D, if only one corner point of the junction K is still located in the channel 1d.

Accordingly, it is particularly advantageous if there is even no corner point of the junction K within the channel 1d, so that the arrangement can be designated "junction-free".

Figure 7:
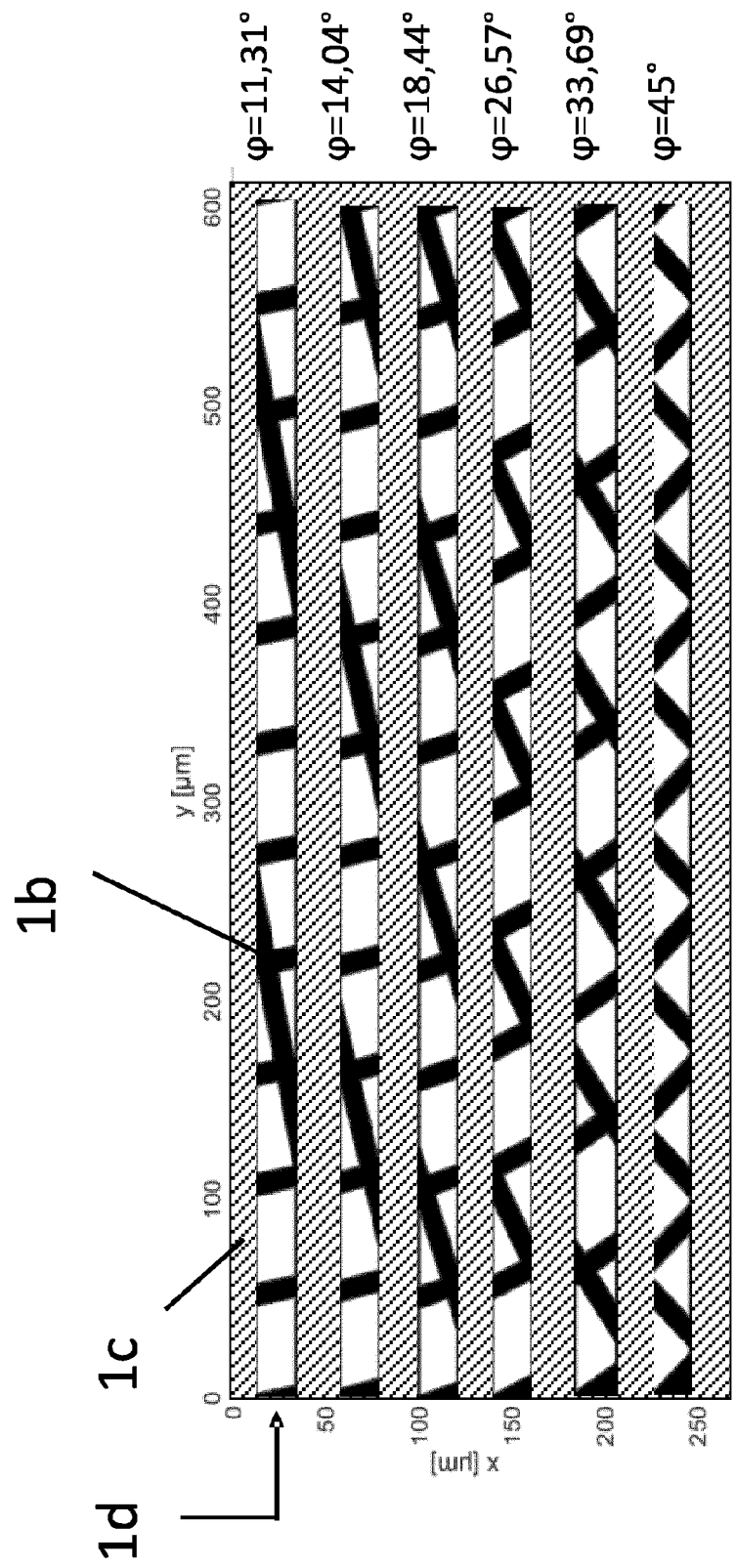
FIG. 7 shows partial details of several further exemplary embodiments of screen printing forms according to the invention.

Various alternative exemplary embodiments of a screen printing form according to the invention are shown in FIG. 7 with associated parameters.

LIST OF DESIGNATIONS

1, 1' Screen printing form
1a Frame
1b Screen printing fabric
K Junction
1c Stencil
1d Channel
D Axis of rotation
2 Screen printing paste
3 Squeegee
4 Structure of printing paste
5 Semiconductor substrate
6 Shuttle

The invention claimed is:
1. A screen printing form (1, 1') for use in a screen printing method, the screen printing form comprising:
a screen printing fabric (1b) with a multiplicity of elongate woven fabric elements, which are arranged in a first element direction and a second direction perpendicular thereto;

a stencil (1c) arranged on the screen printing fabric (1b), which has at least one opening formed as a straight channel with a channel width BK;

wherein the woven fabric elements have a first spacing (AF) in the first element direction and a spacing which deviates by less than 5% from the first spacing (AF) in the second element direction, and the woven fabric elements have a diameter (DG) in the first element direction and a first diameter which deviates by less than 5% from the first diameter (DG) in the second element direction;

the channel (1d) encloses with the first element direction an angle (φ) with a tolerance of +/−0.1°, and the channel width BK of the channel is less than or equal to a maximum width (BKmax) associated with the angle (φ), wherein the angle (φ) is one of the following:

the angle φ[°] from the group 11.31°, 14.04°, 18.44°, 26.57°, 45° with an associated maximum width (BKmax) [μm] according to $$BK_{max}=(2DG+AF)\sin \varphi + DG \cos \varphi$$

or the angle φ[°]=33.69°, with an associated maximum width (BKmax) [μm] according to $$BK_{max}=(2DG+AF)\cos \varphi + DG \sin \varphi,$$

and the channel width (BK) is smaller than the spacing between two woven fabric elements in the second thread direction and in the first thread direction.

2. The screen printing form (1, 1') as claimed in claim 1, wherein at least one of the woven fabric elements have the first spacing (AF) in the first element direction and the spacing which deviates by less than 2% from the first spacing (AF) in the second element direction or the woven fabric elements have the first diameter (DG) in the first element direction and the diameter which deviates by less than 2% from the first diameter (DG) in the second element direction.

3. The screen printing form (1, 1') as claimed in claim 1 wherein the stencil (1c) includes a plurality of straight parallel channels.

4. The screen printing form (1, 1') as claimed in claim 3, wherein the channels have a spacing which corresponds to an integer multiple of the spacing of the woven fabric elements in at least one of the first or second thread direction.

5. The screen printing form (1, 1') as claimed in claim 1, wherein the channel (1d) encloses with the first element direction the angle (φ) with a tolerance of +/−0.1°, and the channel width (BK) of the channel is less than or equal to the maximum width (BKmax) associated with the angle (φ), as follows:

for the angle (φ)[°] from the group 11.31°, 14.04°, 18.44°, 26.57°, 45°, the maximum (width BKmax) [μm] is according to $$BK_{max,21}=AF \sin \varphi + DG \cos \varphi$$

or for the angle (φ)[°]=33.69°, the associated maximum width (BKmax) [μm] is according to $$BK_{max,21}=(2DG+AF)(\cos \varphi - \sin \varphi).$$

6. The screen printing form (1, 1') as claimed in claim 5, wherein the first distance (AF) and the first diameter (DG) are selected such that with a condition BKmax=$BK_{max1}$ and the angle (φ)[°] from the group 11.31°, 14.04°, 18.44°, 26.57°, 45°, the following $$\varphi < \tan^{-1}\left(\frac{DG}{DG+AF}\right)$$

additionally applies, and with the angle (φ)[°]=33.69°, the following $$\varphi > \tan^{-1}\left(\frac{AF}{AF+DG}\right)$$

additionally applies, with a condition BKmax=$BK_{max0}$ and the angle (φ)[°] from the group 11.31°, 14.04°, 18.44°, 26.57°, 45°, the following $$\varphi > \tan^{-1}\left(\frac{DG}{AF}\right)$$

additionally applies, and with the angle (φ)[°]=33.69°, the following $$\varphi > \tan^{-1}\left(\frac{AF}{AF+DG}\right)$$

additionally applies.

7. The screen printing form (1, 1') as claimed in claim 5, wherein the channel (1d) encloses with the first element direction the angle (φ) with a tolerance of +/−0.1°, and the channel width (BK) of the channel is less than or equal to the maximum width (BKmax) associated with the angle (φ), as follows:

for the angle φ[°] from the group 11.31°, 14.04°, 18.44°, 26.57°, 45°, the associated maximum width (BKmax) [μm] is according to $$BK_{max,1}=(2DG+AF)\sin \varphi - DG \cos \varphi$$

or for the angle φ[°]=33.69°, the associated maximum width (BKmax) [μm] is according to $$BK_{max,1}=AF(\cos \varphi - \sin \varphi).$$

8. The screen printing form (1, 1') as claimed in claim 7, wherein the channel (1d) encloses with the first element direction the angle (φ) with a tolerance of +/−0.1°, and channel width (BK) of the channel is less than or equal to the maximum width (BKmax) associated with the angle φ, as follows:

for the angle (φ)[°] from the group 11.31°, 14.04°, 18.44°, 26.57°, 45°, the associated maximum width ($BK_{max}$) [μm] s according to $$BK_{max,0} = AF \sin \varphi - DG \cos \varphi$$

or for the angle (φ)[°]=33.69°, the associated maximum width (BKmax) [μm] is according to $$BK_{max,0} = AF \cos \varphi - (2DG + AF) \sin \varphi.$$

9. A screen printing device for applying a screen printing paste (2) to a substrate, the screen printing device comprising:
  the screen printing form (1, 1') as claimed in claim 1, and at least one squeegee (3),
  wherein the screen printing device is configured to apply screen printing paste (2) to a substrate through the screen printing form (1, 1') using the squeegee.

10. A screen printing method for applying a screen printing paste (2) to a substrate, the method comprising:
  applying the screen printing paste (2) to the substrate through the screen printing form (1, 1') according to claim 1 at least one squeegee (3).

* * * * *